United States Patent
Lu et al.

(10) Patent No.: US 10,868,545 B2
(45) Date of Patent: Dec. 15, 2020

(54) LOW POWER CLOCK NETWORK

(71) Applicant: Taiwan Semiconductor Manufacturing Company, Ltd., Hsinchu (TW)

(72) Inventors: Po Chun Lu, Hsinchu (TW); Shao-Yu Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/577,492

(22) Filed: Sep. 20, 2019

(65) Prior Publication Data

US 2020/0136627 A1    Apr. 30, 2020

Related U.S. Application Data

(60) Provisional application No. 62/751,822, filed on Oct. 29, 2018.

(51) Int. Cl.
| | |
|---|---|
| *H03D 3/24* | (2006.01) |
| *H03L 7/07* | (2006.01) |
| *H03L 7/099* | (2006.01) |
| *H03L 7/23* | (2006.01) |

(52) U.S. Cl.
CPC .............. *H03L 7/07* (2013.01); *H03L 7/0992* (2013.01); *H03L 7/0994* (2013.01); *H03L 7/23* (2013.01)

(58) Field of Classification Search
CPC ..... H04L 7/0033; H03L 7/0891; H03L 7/093; H03L 7/1974; H03L 7/0998; G06F 1/10; G06F 1/12
USPC .......................... 375/376, 373; 455/103, 127
See application file for complete search history.

(56) References Cited

U.S. PATENT DOCUMENTS

| | | | |
|---|---|---|---|
| 6,751,786 B2 | 6/2004 | Teng et al. | |
| 2008/0309417 A1* | 12/2008 | Bonwick | G01R 31/3016 331/57 |
| 2016/0239042 A1* | 8/2016 | Yoshiki | G06F 1/10 |
| 2018/0097523 A1* | 4/2018 | Hoshyar | H03L 7/1976 |
| 2019/0230304 A1* | 7/2019 | Moore | H03L 7/099 |

* cited by examiner

*Primary Examiner* — Khai Tran
(74) *Attorney, Agent, or Firm* — Merchant & Gould P.C.

(57) ABSTRACT

A first clock signal is generated from a reference clock signal. A first frequency associated with the first clock signal is less than a reference clock frequency associated with the reference clock signal. The first clock signal is propagated towards a first component of an integrated circuit through a clock tree. A second clock signal having a second frequency is generated from the first clock signal at a terminal point of the clock tree. The second clock signal is provided to the first component.

20 Claims, 8 Drawing Sheets

LOW POWER CLOCK NETWORK

PRIORITY CLAIM AND CROSS-REFERENCE

This application claims priority to U.S. Provisional Patent Application No. 62/751,822 titled "CLOCK NETWORK" filed Oct. 29, 2018, the disclosure of which is hereby incorporated by reference in its entirety.

BACKGROUND

A clock tree is a clock distribution network within an integrated circuit or a chip. The clock tree includes a clocking circuitry and devices from a clock source to clock destinations. Since an integrated circuit or a chip can have several functional blocks with different clock performance requirements and frequencies, a clock tree refers to the various clock signals feeding those blocks. For example, a single reference clock signal is cascaded and synthesized into many different output clock signals, resulting in a tree structure with the reference clock signal forming the trunk of the tree and various output clock signals form the branches of the tree.

The clock tree is usually responsible for approximately one third of the total power consumption of a chip. For example, in normal operation, clock signals continue to toggle at every clock cycle resulting in power consumption. In addition, the clock tree is a significant source of power consumption because it switches at a maximum rate and typically has larger capacitive loads.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides a clock network and a method for providing clock signal to an integrated circuit. The disclosed clock network reduces an operation frequency of the clock signal in a clock tree. For example, the disclosed clock network is operative to reduce the operation frequency of the clock signal in the clock tree by one-half of the reference clock signal frequency (also referred to as the original frequency). The disclosed clock network is then operative to restore the frequency of the clock signal to a desired frequency of a destination component before providing the clock signal to the destination component. For example, the operation frequency of the clock signal is restored to the original frequency before it is provided to a flip-flop of the integrated circuit.

In example embodiments, the disclosed clock network includes a reduction circuit and a restoration circuit. The reduction circuit is operative to receive the reference clock signal and generate a first clock signal from the received reference clock signal. The first clock signal has a first frequency which is less than a reference clock frequency of the reference clock signal. For example, the frequency of the first clock signal is one-half of the frequency of the reference clock signal. The first clock signal is propagated through branches of a clock tree. A combination circuit is connected to end points (also referred to as terminal points) of the clock tree and is operative to produce a destination clock signal from the first clock signal. The destination clock signal is fed to blocks of the integrated circuit. In example embodiments, the frequency of the destination clock signal is substantially the same as the reference clock frequency.

Figure 1:
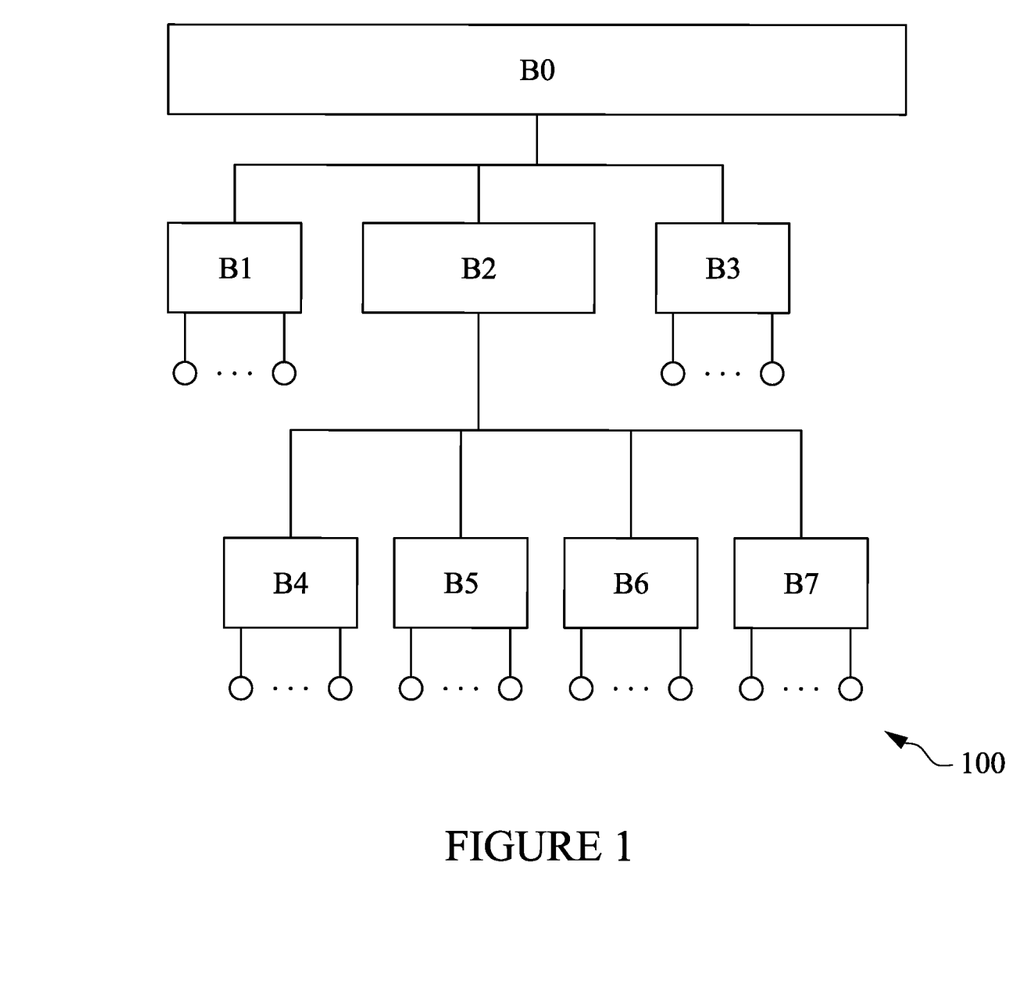
FIG. 1 illustrates an example block diagram illustrating a hierarchical integrated circuit design, in accordance with some embodiments.

FIG. 1 illustrates an example block diagram of an example integrated circuit 100. Integrated circuit 100 includes a plurality of blocks, for example blocks B0, B1, B2, B3, B4, B5, B6, and B7. Each of blocks B0, B1, B2, B3, B4, B, B6, and B7 may further include various cells (not shown). Blocks B0, B1, B2, B3, B4, B5, B6, and B7 and various cells may represent a functional unit of integrated circuit 100 or circuit element. For example, blocks B0, B1, B2, B3, B4, B5, B6, and B7 and various cells may include logic circuits, latches, registers, and flip-flops.

As illustrated in FIG. 1, integrated circuit 100 has a hierarchical design. For example, block B0 is forms a first level and associated with blocks B1, B2, and B3 which form second level of integrated circuit 100. The first level and the second level are also referred to as top level of integrated circuit 100. Block B2 is associated with blocks B4, B5, B6, and B7. As a result, blocks B4, B5, B6, and B7 form a third level of integrated circuit 100. Although not shown in FIG. 1, it will be apparent with a person with ordinary skill in the art after reading the disclosure that blocks B1 and B3 may also have one or more third level blocks. It is to be noted that the three hierarchical levels shown in FIG. 1 are an example, and for the purpose of illustration. There can be a different number of hierarchical levels in an integrated circuit without diverting from the scope of the present invention.

In example embodiments, integrated circuit 100 implements logic circuits that are clocked by externally generated clock signals. For example, integrated circuit 100 can have hundreds or thousands of clocked devices, such as, latches, registers, and flip-flops. Through clock tree synthesis, a clock tree is designed for routing clock signal from a reference clock concurrently to all blocks and cells of integrated circuit 100.

Figure 2:
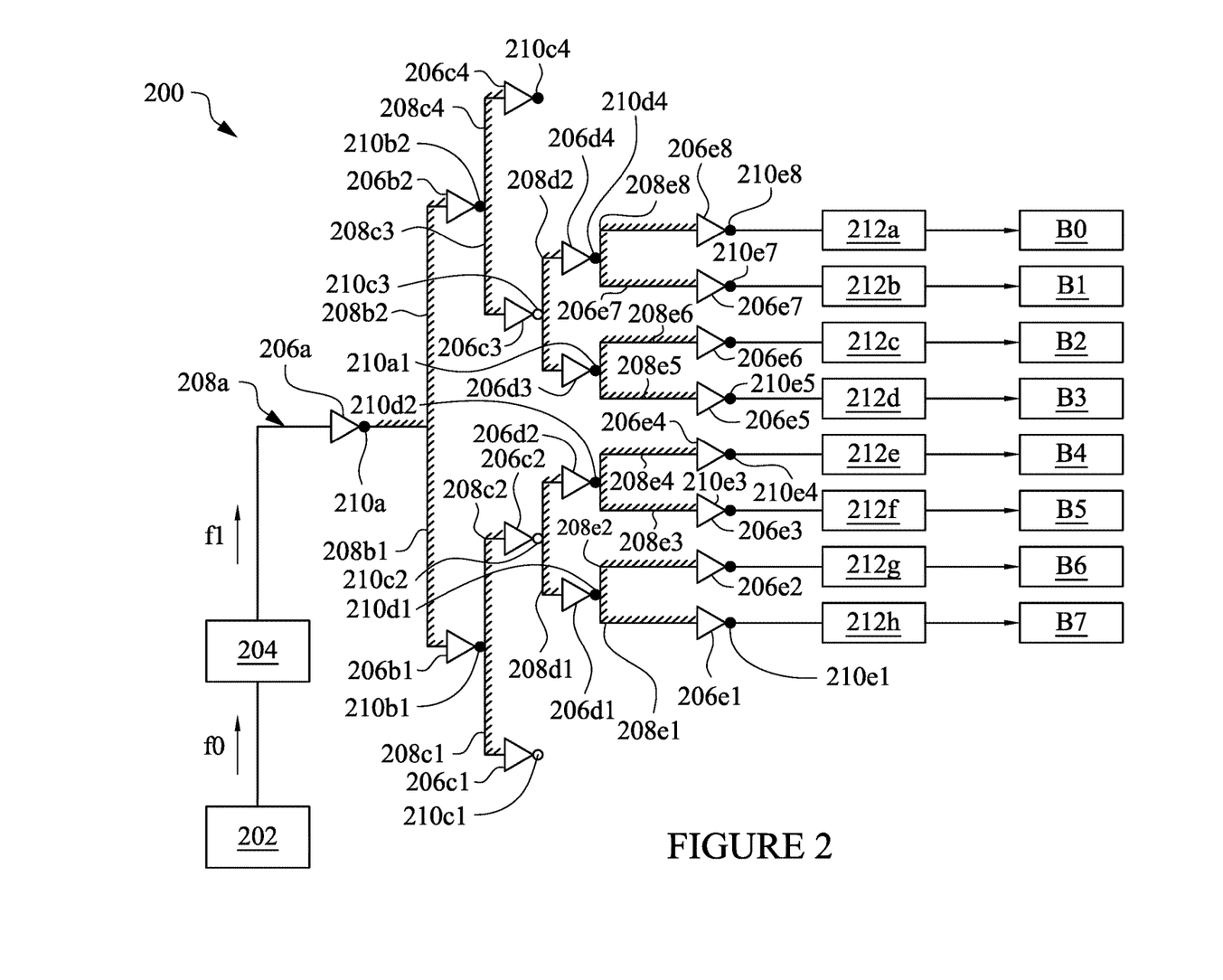
FIG. 2 is a diagram illustrating an example clock tree, in accordance with some embodiments.

FIG. 2 is a diagram illustrating an example clock tree 200. Example clock tree 200 is a one way clock tree and is used to distribute a reference clock signal to components of integrated circuit 100. For example, clock tree 100 is operative to distribute a reference clock signal to blocks B0, B1, B2, B3, B4, B5, B6, and B7 of integrated circuit 100. Clock tree 200 includes a primary input 202 which is operative to generate the reference clock signal and a reduction circuit 204 connected to primary input 202. Clock tree 100 further includes repower buffers 206a, 206b1, 206b2, 206c1, 206c2, 206c3, 206c4, 206d1, 206d2, 206d3, 206d4, 206e1, 206e2, 206e3, 206e4, 206e5, 206e6, 206e7, and 206e8 (collectively referred to as repower buffers 206), and branching wires 208a, 208b1, 208b2, 208c1, 208c2, 208c3, 208c4, 208d1, 208d2, 208d3, 208d4, 208e1, 208e2, 208e3, 208e4, 208e5, 208e6, 208e7, and 208e8 (collectively referred to as branching wires 208). Moreover, clock tree 200 includes terminal points 210a, 210b1, 210b2, 210c1, 210c2, 210c3, 210c4, 210d1, 210d2, 210d3, 210d4, 210e1, 210e2, 210e3, 210e4, 210e5, 210e6, 210e7, and 210e8 (collectively referred to as terminal points 210) and combination circuits 212a, 212b, 212c, 212d, 212e, 212f, 212g, and 212h (collectively referred to as combination circuits 212).

In example embodiments, branching wires 208 are laid out in a hierarchal succession to form various levels of clock tree 200. A new level of clock tree 200 is formed from terminal points 210 of the preceding level. Each terminal points 210 in clock tree 200 include one of repower buffers 206 for repowering the clock signal for distributing the clock signal to the following level. For example, and as shown in FIG. 2, reduction circuit 204 is connected to a first branching wire 208a (also referred to as a trunk 208a). Reduction circuit 204 is operative to feed the clock signal to first branching wire 208a. First branching wire 208a includes a first repower buffer 206a and a first terminal point 210a. Re-power buffer 206a is also referred to as a pre-driver buffer 206a, is operative to repower the clock signal and first terminal point 210a is operative to feed the repowered clock signal to a next level of branching wires 208.

For example, next level, which is also referred to as a first level of clock tree 200, includes a second branching wire 208b1 and a third branching wire 208b2. First terminal point 210a feeds the repowered clock signal to both second branching wire 208b1 and a third branching wire 208b2.

Second branching wire 208b1 includes a second repower buffer 206b1 and a second terminal point 210b1. Third branching wire 208b2 includes a third repower buffer 206b2 and a third terminal point 210b2. Each of second terminal point 210b1 and a third terminal point 210b2 feed the clock signal to a second level on clock tree 200.

The second level includes a fourth branching wire 208c1, a fifth branching wire 208c2, a sixth branching wire 208c3 and a seventh branching wire 208c4. Fourth branching wire 208c1 includes a fourth repower buffer 206c1 and a fourth terminal point 210c1. Fifth branching wire 208c2 includes a fifth repower buffer 206c2 and a fifth terminal point 210c2. Sixth branching wire 208c3 includes a sixth repower buffer 206c3 and a sixth terminal point 210c3. Seventh branching wire 208c4 includes a seventh repower buffer 206c4 and a seventh terminal point 210c4. Each of fourth terminal point 210c1, fifth terminal point 210c2, sixth terminal point 210c3, and seventh terminal point 210c4 propagate the clock signal to a third level of clock tree 200.

The third level includes an eighth branching wire 208d1, a ninth branching wire 208d2, a tenth branching wire 208d3 and an eleventh branching wire 208d4. Eighth branching wire 208d1 includes an eighth repower buffer 206d1 and an eighth terminal point 210d1. Ninth branching wire 208d2 includes a ninth repower buffer 206d2 and a ninth terminal point 210d2. Tenth branching wire 208d3 includes a tenth repower buffer 206d3 and a tenth terminal point 210d3. Eleventh branching wire 208d4 includes an eleventh repower buffer 206d4 and an eleventh terminal point 210d4. Each of eighth terminal point 210d1, ninth terminal point 210d2, tenth terminal point 210d3, and eleventh terminal point 210d4 propagate the clock signal to a fourth level of clock tree 200.

The fourth level includes a twelfth branching wire 208e1, a thirteenth branching wire 208e2, a fourteenth branching wire 208e3, a fifteenth branching wire 208e4, a sixteenth branching wire 208e5, a seventeenth branching wire 208e6, an eighteenth branching wire 208e7, and a nineteenth branching wire 208e7. Twelfth branching wire 208e1 includes a twelfth repower buffer 206e1 and a twelfth terminal point 210e1. Thirteenth branching wire 208e2 includes a thirteenth repower buffer 206e2 and a thirteenth terminal point 210e2. Fourteenth branching wire 208e3 includes a fourteenth repower buffer 206e3 and a fourteenth terminal point 210e3. Fifteenth branching wire 208e4 includes a fifteenth repower buffer 206e4 and a fifteenth terminal point 210e4. Sixteenth branching wire 208e5 includes a sixteenth repower buffer 206e5 and a sixteenth terminal point 210e5. Seventeenth branching wire 208e6 includes a seventeenth repower buffer 206e6 and a seventeenth terminal point 210e6. Eighteenth branching wire 208e7 includes an eighteenth repower buffer 206e7 and an eighteenth terminal point 210e7. Nineteenth branching wire 208e8 includes a nineteenth repower buffer 206e8 and a nineteenth terminal point 210e8.

In example embodiments, each of fourth level branches, that is, twelfth branching wire 208e1, thirteenth branching wire 208e2, fourteenth branching wire 208e3, fifteenth branching wire 208e4, sixteenth branching wire 208e5, seventeenth branching wire 208e6, eighteenth branching wire 208e7, and nineteenth branching wire 208e8 is also referred to as leaf branches. In example embodiments, terminal points 210 of the leaf branches provide the clock signal to restoration circuits 212. For example, and as illustrated in FIG. 2, twelfth terminal point 210e1 is connected to a first restoration circuit 212a, thirteenth terminal point 210e2 is connected to a second restoration circuit 212b, fourteenth terminal point 210e3 is connected to a third restoration circuit 212c, and fifteenth terminal point 210e4 is connected to a fourth restoration circuit 212d. Moreover, sixteenth terminal point 210e5 is connected to a fifth restoration circuit 212e, seventeenth terminal point 210e6 is connected to a seventh restoration circuit 212f, eighteenth terminal point 210e7 is connected to an eight restoration circuit 212g, and nineteenth terminal point 210e8 is connected to an eighth restoration circuit 212g.

Restorations circuits 212 are connected to a block of integrated circuit 100. For example first restoration circuit 212a is connected to block B0, second restoration circuit 212b is connected to a block B1, third restoration circuit 212c is connected to block B2, and fourth restoration circuit 212d is connected to block B3. Moreover, fifth restoration circuit 212e is connected to block B4, sixth restoration circuit 212f is connected to block B5, seventh restoration circuit 212g is connected to block B6, and eighth restoration circuit 212g is connected to block B7.

In example embodiments, reduction circuit 204 processes the reference clock signal from primary input 202 and produce a first clock signal. For example, reduction circuit 204 is operative to produce the first clock signal having a first frequency (f1) which is less than a reference clock frequency (f0) of the reference clock signal. In example embodiments, the first frequency (f1) is one-half of the reference clock frequency (f0). Reduction circuit 204 can be a frequency division circuit such as a binary division circuit. An example reduction circuit 204 is provided with reference to FIG. 3A.

Although, reduction circuit 204 is shown to be connected between primary input 202 and pre-driver buffer 206a, it will be apparent to a person with ordinary skill in the art after reading this disclosure that reduction circuit 204 can be located at a different position in clock tree 200.

Figure 3A:
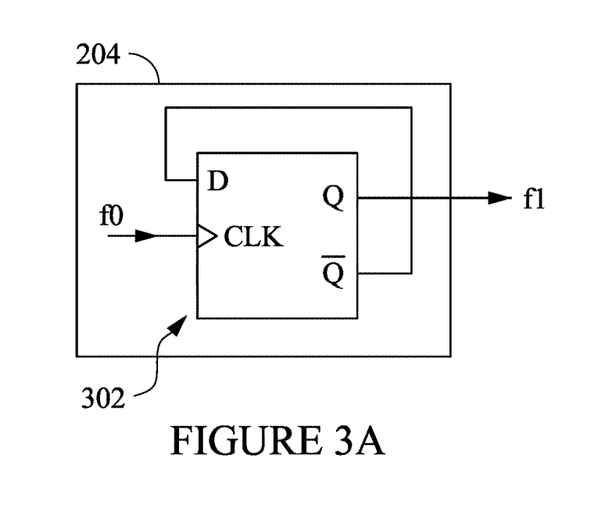
FIG. 3A is a diagram illustrating an example reduction circuit, in accordance with some embodiments.

FIG. 3A illustrates an example reduction circuit 204. As shown in FIG. 3A, reduction circuit 204 includes a flip-flop 302. Flip-flop 302 is a D flip-flop (where D stands for data) having CLK, D, Q, and Qbar terminals. The Qbar terminal is connected to the D terminal, thereby feeding back an output from the Qbar terminal as an input to the D terminal. D terminal is also referred to as input terminal. The reference clock signal is input to the CLK terminal and the first clock signal is received as an output at the Q terminal.

Figure 3B:
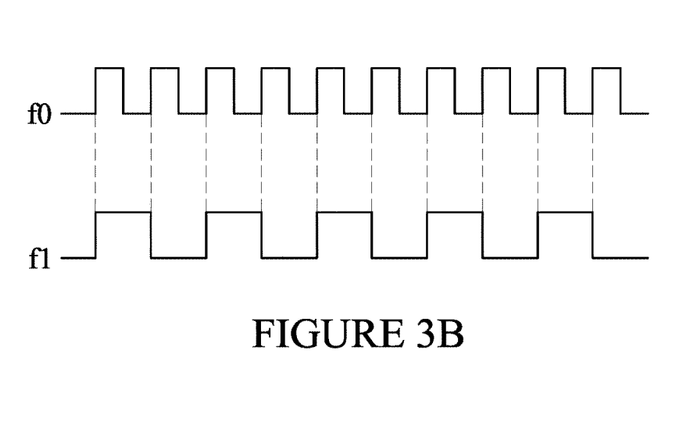
FIG. 3B is a diagram illustrating waveforms associated with the example reduction circuit of FIG. 3A, in accordance with some embodiments.

FIG. 3B illustrates waveforms associated with reduction circuit 204. As shown in FIG. 3B, the first frequency (f1) associated with the first clock signal received as output at the Q terminal is approximately one half of the reference clock frequency (f0) associated with the reference clock signal. As a result, reduction circuit 204 of FIG. 3A produces frequency division as it divides the reference clock frequency (f0) by a factor of two. In example embodiments, the output from D flip flop 302 can be connected to CLK terminal of another similar flip flop 302 to divide the reference clock frequency (f0) by a factor of four, and so on.

Although, the reference clock frequency (f0) is shown to be divided by a D flip-flop connected in a feedback mode, it will be apparent to persons with ordinary skill in the art after reading this disclosure that other types of circuits or flip-flops can be used for the frequency division. For example, a J-K flip-flop or a toggle flip-flop can be used. Similarly, although, the reference clock frequency (f0) is shown to be divided a factor of two or multiples of two, it will be apparent to persons with ordinary skill in the art after reading this disclosure that the reference clock frequency (f0) can be divided by other factors, such as of three or five.

Referring again to FIG. 2, combination circuits 212 process the first clock signal (f1) to produce a third clock signal having a third frequency (f3). In example embodiments, the third frequency (f3) is approximately equal to the reference clock frequency (f0). In another example, the third frequency (f3) is approximately equal to a predetermined frequency for one or more of blocks B0, B1, B2, B3, B4, B5, B6, and B7 of integrated circuit 100. For example, the third frequency (f3) is approximately equal to one-fourth or twice of the reference clock frequency (f0).

In example embodiments, although combination circuits 212 are shown to be connected after terminal points 210 in FIG. 2, it will be apparent to a person with ordinary skill in the art after reading this disclosure that combination circuits 212 can be located in other position in clock tree 200. Examples of combination circuits 212 are provided with reference to FIGS. 4A and 5A.

Figure 4A:
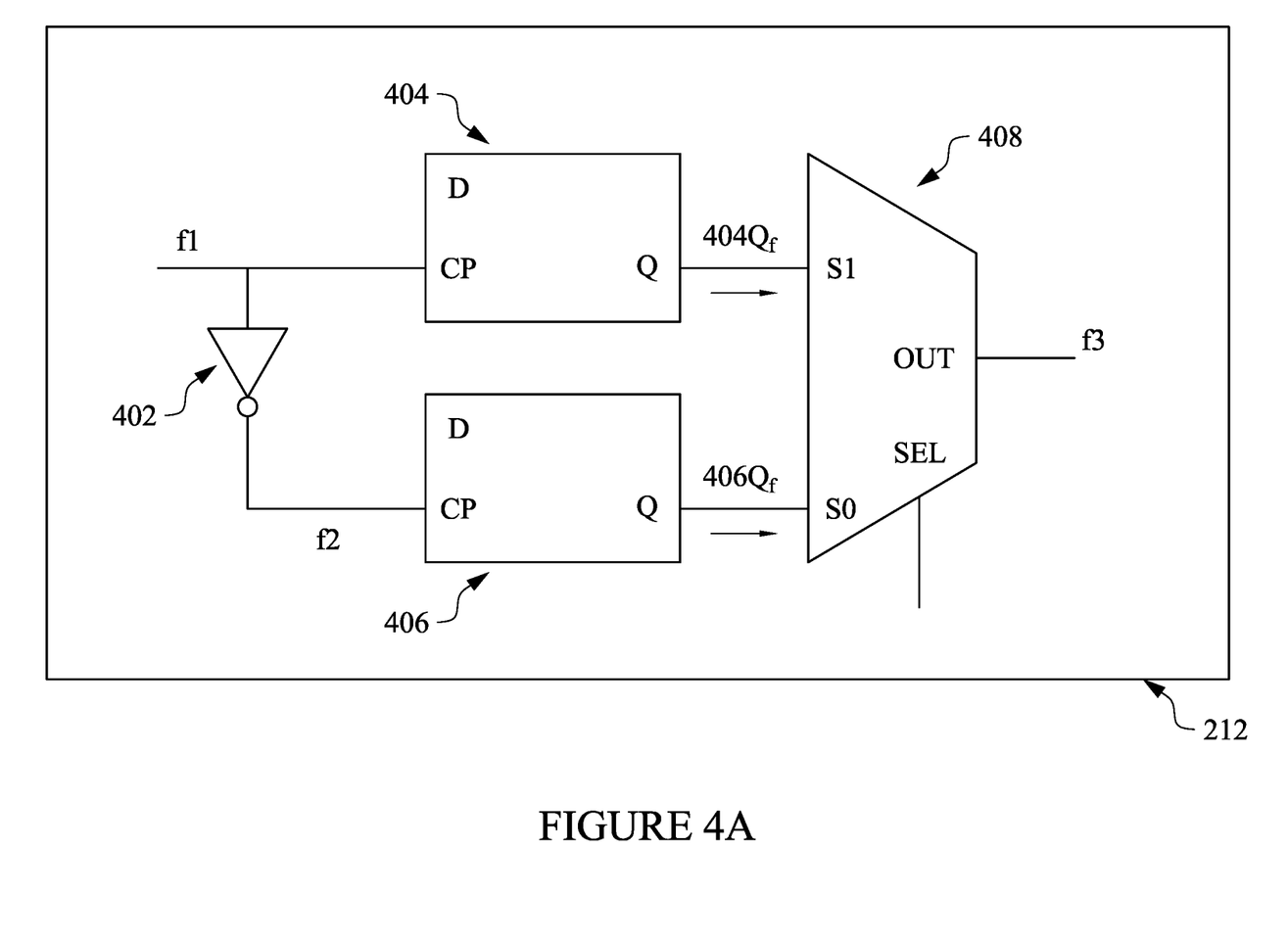
FIG. 4A is a diagram illustrating an example first combination circuit, in accordance with some embodiments.

FIG. 4A illustrates a first example of combination circuits 212. As shown in FIG. 4A, combination circuits 212 include an invertor 402, a first flip-flop 404, a second flip-flop 406, and a data selector 408. First clock signal is provided as an input to invertor 402 and first flip-flop 404. Invertor 402 is operative to invert the first clock signal to provide a second clock signal having a second frequency (f2). The second clock signal is provided as input to second flip-flop 406. In example embodiments, the second frequency (f2) is approximately equal to the first frequency (f1).

Output 404Qf from first flip-flop 404 and output 406Qf second flip-flop 406 are provided as an input to data selector 408. Data selector 408 (also referred to as a multiplexer or MUX) is operative to select an input and provide data from the selected input as an output. Hence, data selector 408 is operative to select one of the outputs from first flip-flop 404 and second flip-flop 406 and provide a third clock signal having a third frequency (f3) as the output.

Figure 4B:
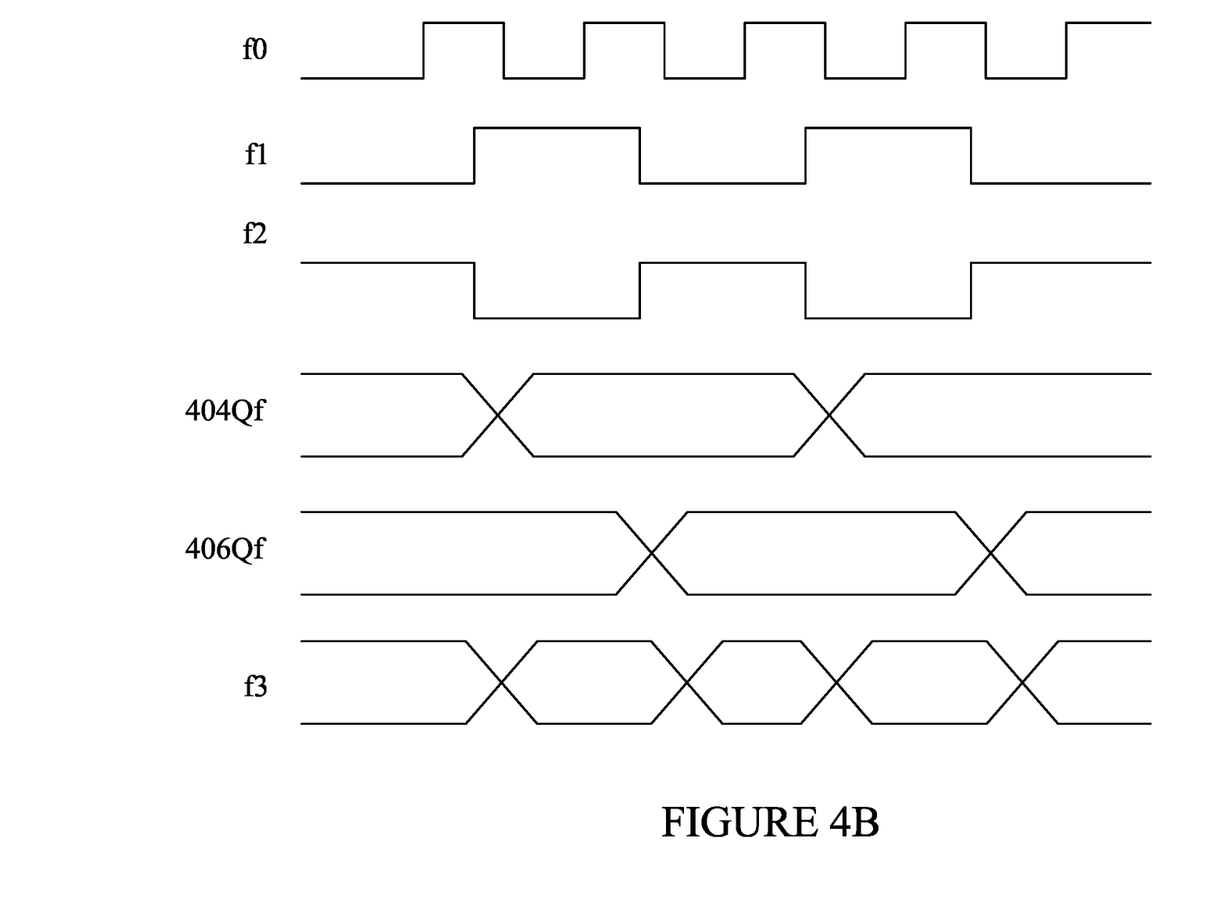
FIG. 4B is a diagram illustrating waveforms associated with the example first combination circuit of FIG. 4A, in accordance with some embodiments.

FIG. 4B illustrates example waveforms associated with example first combination circuit 212 of FIG. 4A. In example embodiments, and as shown in the example waveforms of FIG. 4B, the third frequency (f3) associated with the third clock signal is approximately equal to the reference clock frequency (f0). As a result, example first combination circuit 212 of FIG. 4A is also referred to as a restoration circuit as it restores a clock frequency to the reference clock frequency.

Figure 5A:
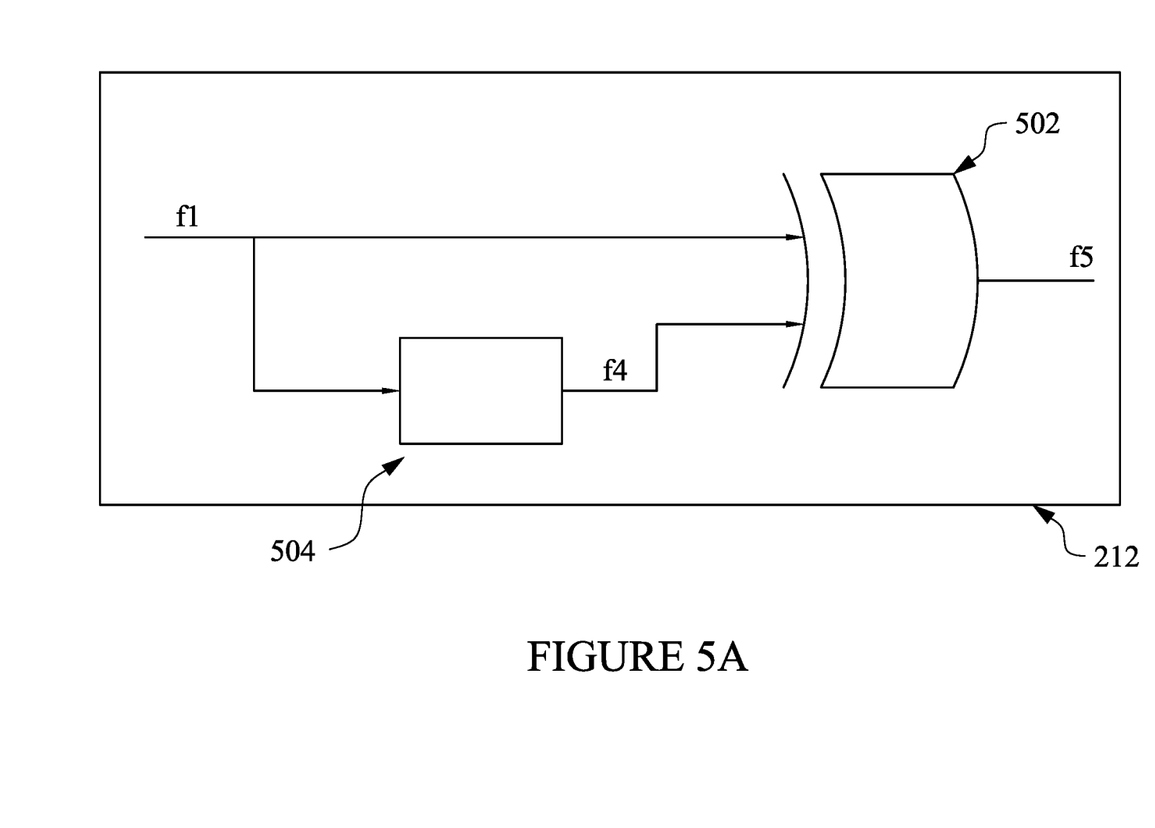
FIG. 5A is a diagram illustrating an example second combination circuit, in accordance with some embodiments.

FIG. 5A illustrates a second example of combination circuit 212. As shown in FIG. 5A, second example combination circuit 212 includes a delay circuit 504 and an exclusive disjunction circuit 502. First clock signal is provided as an input to delay circuit 504 and exclusive disjunction circuit 502. Delay circuit 504 is operative to introduce a predetermined delay in the first clock signal to produce a fourth clock signal having a fourth frequency (f4). Since, delay circuit 504 introduces a delay to the first clock signal without changing its frequency, the fourth frequency (f4) is approximately equal to the first frequency (f1). Output of delay circuit 504 is provided as a second input to exclusive disjunction circuit 502. Exclusive disjunction circuit 502 (also referred to as XOR circuit, a XOR gate, EOR gate, or an exclusive OR gate) is operative to provide a fifth clock signal having a fifth frequency (f5) as an output.

Figure 5B:
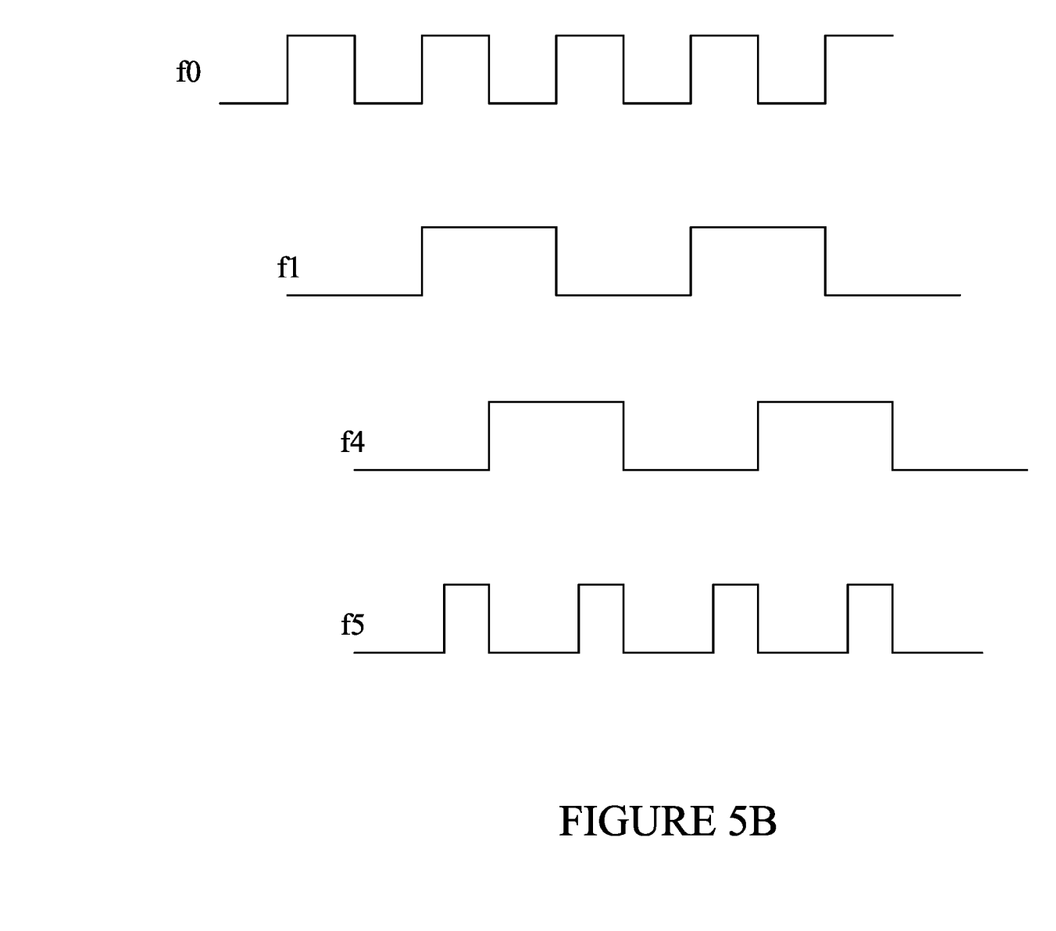
FIG. 5B is a diagram illustrating waveforms associated with the example second combination circuit of FIG. 5A, in accordance with some embodiments.

FIG. 5B illustrates example waveforms associated with example second combination circuit 212 of FIG. 5A. As shown in the example waveforms of FIG. 5B, the first frequency (f1) and the fourth frequency (f4) are approximately equal to one-half of the reference clock frequency (f0). In addition, and as shown in FIG. 5B, there is a pre-determined delay between the first clock signal and the fourth clock signal. In example embodiments, the predetermined delay is more than a switching time of a block (such as block B1) of integrated circuit 100. Moreover, and as shown in FIG. 5B, the fifth frequency (f5) associated with the fifth clock signal is approximately equal to the reference clock frequency (f0). As a result, second example combination circuit 212 of FIG. 5A is also referred to as a restoration circuit as it restores a clock frequency to the reference clock frequency (f0).

Figure 6:
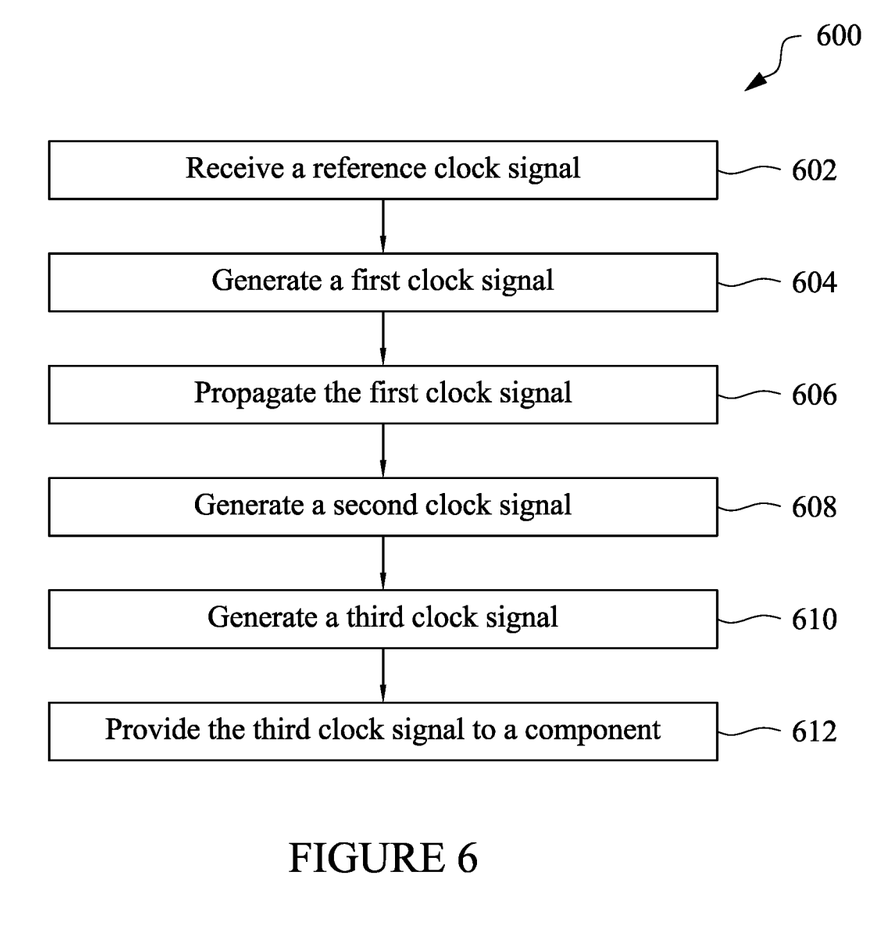
FIG. 6 is a flow diagram illustrating a method for providing clock signals, in accordance with some embodiments.

FIG. 6 illustrates steps of a method 600 for providing clock signal to components of an integrated circuit. For example, method 600 can be used to provide clock signal to blocks B0, B1, B2, B3, B4, B5, B6, and B7 of integrated circuit 100. In example embodiments method 600 can be stored as instructions in a memory device which when executed by a processor configures to processor to execute steps of method 600. In some embodiments, the integrated circuit is located on a chip.

At block 602 of method 600, a reference clock signal is received. The reference clock signal is received from an external clock operative to generate the reference clock signal. The reference clock signal has a reference clock frequency (f0). For example, the reference clock signal is received from reference clock 202. In an example embodiment, the reference clock signal is received at reduction circuit 204.

At block 604 of method 600, a first clock signal is generated. The first clock signal is generated by processing the reference clock signal. For example, the first clock signal is generated by reducing the reference clock frequency (f0) of the reference clock signal. In example embodiments, the frequency of the reference clock signal is reduced by dividing the reference clock frequency. For example, the frequency of the reference clock signal is divided by a factor of two to generate the first clock signal. Thus, a first frequency (f1) of the first clock signal is approximately equal to one-half of the reference clock frequency (f0). In example embodiments, the first clock signal is generated by reduction circuit 204.

At block 606 of method 600, the first clock signal is propagated. The first clock signal is propagated through a clock tree to leaf branches or terminal points of the clock tree. For example, the first clock signal is propagated from reduction circuit 204 through clock tree 200 towards combination circuit 212. In example embodiments, since the first clock signal is propagated at the first frequency (f1), which is one-half of the reference clock frequency (f0), the energy consumption by components of the clock tree is reduced by approximately half of the normal amount.

At block 608 of method 600 a second clock signal is generated. The second clock signal is generated from the first clock signal. In example embodiments, the second clock signal is generated by either inverting the first clock signal or introducing a predetermined delay in the first clock signal. For example, the second clock signal is generated by inverting the first clock signal using invertor 402. Alternatively, the second clock signal is generated by introducing a predetermined delay in the first clock signal using delay circuit 410. In an example embodiment, a second frequency (f2) associated with the second clock signal is approximately equal to the first clock frequency (f1) of the first clock signal.

At block 610 of method 600 a third clock signal is generated. The third clock signal is generated from the first clock signal and the second clock signal. For example, the third clock signal is generated by combining the first clock signal and the second signal. In a first example, the first clock signal and the second signal can be combined by multiplexing or determining exclusive disjunction. For example, combination circuit 212 is operative to generate the third clock signal from the second clock signal. As discussed previously, the third frequency (f3) associated with the third clock signal is approximately equal to the reference clock frequency (f0) associated with the reference clock signal.

At block 612 of method 600, the third clock signal is provided to a component. For example, the third clock signal is provided to one of one or more of blocks B0, B1, B2, B3, B4, B5, B6, and B7 of integrated circuit 100. In example embodiments, the one or more blocks B0, B1, B2, B3, B4, B5, B6, and B7 of integrated circuit 100 receive the third clock signal having approximately the same frequency as the reference clock frequency (f0).

In example embodiments, the disclosed clock network leads to lower power consumption by clock tree 200 because of the lower frequency while maintaining integrated circuit's 100 performance. The impact of leakage power on delay circuit 504 and exclusive disjunction circuit 502 is reduced by shutting off high frequency components (for example, a central processing unit or CPU) through a power management block. Moreover, the impact of power consumption by delay circuit 504 and exclusive disjunction circuit 502 is small since their output load capacitance is small compared to the output load capacitance of components of clock tree 200.

In accordance with an example aspect of the disclosure, a method of providing a reference clock comprises: generating a first clock signal from a reference clock signal, wherein a first frequency associated with the first clock signal is less than a reference clock frequency associated with the reference clock signal; propagating the first clock signal towards a component of an integrated circuit through a clock tree; generating a second clock signal having a second frequency from the first clock signal, wherein generating the second clock signal comprises generating the second clock signal at a terminal point of the clock tree; and providing the second clock signal to the first component.

In accordance with an example aspect of the disclosure, an integrated circuit comprises: a plurality of components; a reduction circuit operative to receive a reference clock signal and generate a first clock signal from the received reference clock signal; a clock tree comprising a plurality of leaf branches, the clock tree being operative to propagate the first clock signal to the plurality of leaf branches; and a combination circuit operative to: receive the first clock signal from one of the plurality of leaf branches, generate a second clock signal from the first clock signal, and provide the second clock signal to at least one of the plurality of components, wherein the second clock signal has substantially same frequency as that of the reference clock signal.

In accordance with an example aspect of the disclosure, a chip comprises: an integrated circuit comprising at least one block; and a clock tree operative to provide reference clock signal to the at least one block, wherein the clock tree comprises: a reduction circuit operative to: receive the reference clock signal, generate a first clock signal, propagate the first clock signal to a plurality of leaf branches; and a combination circuit operative to: receive the first clock signal from one of the plurality of leaf branches, generate a second clock signal from the first clock signal, and provide the second clock signal to the at least one block.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of providing a reference clock, the method comprising:
   generating a first clock signal from a reference clock signal, wherein a first frequency associated with the first clock signal is less than a reference clock frequency associated with the reference clock signal;
   propagating the first clock signal toward a first component of an integrated circuit through a clock tree;
   generating a second clock signal having a second frequency from the first clock signal, wherein generating the second clock signal comprises generating the second clock signal at a terminal point of the clock tree, and wherein generating the second clock signal further comprises:
      generating a third clock signal; and
      combining the first clock signal and the third clock signal to generate the second clock signal; and
   providing the second clock signal to the first component.

2. The method of claim 1, wherein generating the first clock signal comprises reducing the reference clock frequency of the reference clock signal by a predetermined ratio.

3. The method of claim 2, wherein reducing the reference clock frequency comprises dividing the reference clock frequency by a factor of two whereby reducing an amount of power consumed by the clock tree.

4. The method of claim 1, wherein generating the third clock signal comprises inverting the first clock signal to generate the third clock signal.

5. The method of claim 4, further comprising combining the first clock signal and the third clock signal by multiplexing the first clock signal and the third clock signal to generate the second clock signal.

6. The method of claim 1, wherein generating the third clock signal comprises introducing a predetermined delay in the first clock signal.

7. The method of claim 6, further comprising combining the first clock signal and the third clock signal by determining exclusive disjunction of the first clock signal and the third clock signal to generate the second clock signal.

8. The method of claim 7, wherein determining exclusive disjunction of the first clock signal and the third clock signal comprises determining to generate the second clock signal.

9. An integrated circuit, comprising:
   a plurality of components;
   a reduction circuit operative to receive a reference clock signal and generate a first clock signal from the received reference clock signal;
   a clock tree comprising a plurality of leaf branches, the clock tree being operative to propagate the first clock signal to the plurality of leaf branches; and
   a combination circuit operative to:
      receive the first clock signal from one of the plurality of leaf branches,
      generate a second clock signal from the first clock signal, and
      provide the second clock signal to at least one of the plurality of components, wherein the second clock signal has substantially the same frequency as that of the reference clock signal.

10. The integrated circuit of claim 9, wherein the reduction circuit is a binary division circuit.

11. The integrated circuit of claim 10, wherein the binary division circuit comprises a D flip-flop in a feedback mode.

12. The integrated circuit of claim 9, wherein a first frequency associated with the first clock signal is one half of a reference clock frequency associated with the reference clock signal.

13. The integrated circuit of claim 9, wherein the clock tree further comprises a trunk, and wherein the reduction circuit is located at the trunk of the clock tree.

14. A chip comprising:
   an integrated circuit comprising at least one block; and
   a clock tree operative to provide reference clock signal to the at least one block, wherein the clock tree comprises:
      a reduction circuit operative to:
         receive the reference clock signal,
         generate a first clock signal,
         propagate the first clock signal to a plurality of leaf branches; and
      a combination circuit operative to:
         receive the first clock signal from one of the plurality of leaf branches,
         generate a second clock signal from the first clock signal, and
         provide the second clock signal to the at least one block,
      wherein the combination circuit comprises a first flip-flop, a second flip-flop, an invertor, and a data selector, and wherein:
         the first clock signal is provided to the first flip-flop and the invertor;
         the invertor is operative to generate a third clock signal by inverting the first clock signal and provide the third clock signal to the second flip flop,
         the first flip-flop and the second flip-flop are operative to provide the first clock signal and the third clock signal as a first input and a second input respectively to the data selector; and
         the data selector is operative to generate the second clock signal by alternatively selecting one of the first clock signal and the second clock signal.

15. The chip of claim 14, wherein the combination circuit further comprises a delay circuit and an exclusive disjunction circuit, wherein:
   the first clock signal is provided as a first input to the delay circuit and the exclusive disjunction circuit;
   the delay circuit is operative to generate a fourth clock signal by introducing a predetermined delay to the first clock signal and provide the fourth clock signal as a second input to the exclusive disjunction circuit, and
   the exclusive disjunction circuit is operative to generate the second signal by determining an exclusive disjunction of the clock signal and the fourth clock signal.

16. The chip of claim 15, wherein the exclusive disjunction circuit is a XOR logic.

17. The chip of claim 14, wherein the combination circuit is located on one or more leaf branches of the clock tree.

18. The chip of claim 14, wherein the clock tree comprises one or more repower buffers located at a terminal point of a branch.

19. The chip of claim 14, wherein the reduction circuit is a binary division circuit.

20. The chip of claim 19, wherein the binary division circuit comprises a D flip-flop in a feedback mode.

* * * * *